(12) United States Patent
Nam

(10) Patent No.: US 7,282,453 B2
(45) Date of Patent: Oct. 16, 2007

(54) METHOD FOR FABRICATING SEMICONDUCTOR DEVICE

(75) Inventor: Ki-Won Nam, Kyoungki-do (KR)

(73) Assignee: Hynix Semiconductor Inc. (KR)

( * ) Notice: Subject to any disclaimer, the term of this patent is extended or adjusted under 35 U.S.C. 154(b) by 0 days.

(21) Appl. No.: 11/479,008

(22) Filed: Jun. 29, 2006

(65) Prior Publication Data

US 2007/0117390 A1 May 24, 2007

(30) Foreign Application Priority Data

Nov. 24, 2005 (KR) ...................... 10-2005-0112884

(51) Int. Cl.
*H01L 21/461* (2006.01)
(52) U.S. Cl. ...................... 438/710; 438/717; 438/719; 438/724; 438/734; 438/738
(58) Field of Classification Search ................ 438/710, 438/717, 719, 724, 734, 738
See application file for complete search history.

(56) References Cited

U.S. PATENT DOCUMENTS

| | | | | |
|---|---|---|---|---|
| 5,578,517 A | * | 11/1996 | Yoo et al. ................... | 438/601 |
| 5,652,175 A | * | 7/1997 | Chen et al. .................. | 438/694 |
| 5,879,966 A | * | 3/1999 | Lee et al. .................... | 438/132 |
| 6,103,619 A | * | 8/2000 | Lai ............................. | 438/638 |
| 6,284,644 B1 | * | 9/2001 | Aug et al. ................... | 438/623 |
| 6,384,467 B1 | * | 5/2002 | Mitchell et al. ............ | 257/529 |
| 6,531,382 B1 | * | 3/2003 | Cheng et al. ............... | 438/597 |
| 6,677,226 B1 | * | 1/2004 | Bowen et al. .............. | 438/601 |
| 7,074,701 B2 | * | 7/2006 | Cheng et al. ............... | 438/597 |
| 7,115,517 B2 | * | 10/2006 | Ye et al. ..................... | 438/700 |
| 2003/0211725 A1 | * | 11/2003 | Chung et al. ............... | 438/630 |

\* cited by examiner

*Primary Examiner*—Binh X. Tran
(74) *Attorney, Agent, or Firm*—Blakely Sokoloff Taylor & Zafman

(57) ABSTRACT

A method for fabricating a semiconductor device includes forming fuse lines over a substrate, forming a first insulation layer over the fuse lines, the first insulation layer including a silicon-rich oxynitride (SRON) layer at the top, forming a second insulation layer over the first insulation layer, the second insulation layer configured in a multiple-layer structure and including oxide-based materials, performing a first repair etching process to selectively etch the second insulation layer, performing a second repair etching process to remove the second insulation layer remaining after performing the first repair etching process, and performing a third repair etching process to etch the first insulation layer in a manner such that the first insulation layer remains with a predetermined thickness above the fuse lines.

12 Claims, 5 Drawing Sheets

METHOD FOR FABRICATING SEMICONDUCTOR DEVICE

FIELD OF THE INVENTION

The present invention relates to a method for fabricating a semiconductor device, and more particularly, to a method for fabricating a semiconductor device using a repair etching method.

DESCRIPTION OF RELATED ARTS

The size of a chip has become smaller as a semiconductor device has highly integrated, and a faster speed has been demanded in the semiconductor device. Thus, a triple-layer metal line in triple layer metallization (TLM) structure has been used. In the TLM structure, it is generally essential to increase the thickness of an inter-layer insulation layer formed over the metal line.

A plate line has been used as a fuse line for repairs. As mentioned above, the thickness of the inter-layer insulation layer formed over the plate line increases because of the increased layers of metal line. Accordingly, a portion of the inter-layer insulation layer, the portion having a thickness of approximately 3,000 Å, remains above the fuse line when a repair etching process is performed after performing the metal line formation process. If the thickness of the remaining portion of the inter-layer insulation layer is too larger a repair blowing cannot be achieved, and if the thickness of the remaining portion of the inter-layer insulation layer is too small, other fuse lines can be damaged during the repair etching process. That is, each inter-layer insulation layer has a thickness limit, and the thickness limit becomes deteriorated as the thickness of the inter-layer insulation layer increases.

FIG. 1 illustrates a cross-sectional view of a semiconductor device to describe a repair etching method. Fuse lines 12 are formed over a substrate 11. A first inter-layer insulation layer 13 is formed over the fuse lines 12 and the substrate 11. A first metal line 14, a second metal line 16, and a third metal line 18 are formed over the first inter-layer insulation layer 13 in a cell region of the substrate 11. A second inter-layer insulation layer 15, a third inter-layer insulation layer 17, and a passivation layer 19 are formed over each of the first, second, and third metal lines 14, 16, and 18, respectively. A multiple-layer structure including the second inter-layer insulation layer 15, the third inter-layer insulation layer 17, and the passivation layer 19 has an irregular surface profile because of a thickness increase.

A repair etching process is performed to etch the passivation layer 19, the third inter-layer insulation layer 17, the second inter-layer insulation layer 15, and the first inter-layer insulation layer 13, thereby opening a fuse box. The repair etching process for opening the fuse box is performed until a thickness of a portion of the first inter-layer insulation layer 13 remaining above the fuse lines 12 reaches approximately 3,000 Å. After the opening of the fuse box, the first inter-layer insulation layer 13 shows an irregular profile 20 having irregularly thick portions as denoted with reference letters D1, D2, and D3.

Accordingly, because of the thickness increase of the inter-layer insulation layers and the resultant irregular profile during the repair etching process, portions of the inter-layer insulation layers having a small thickness are more likely to be over etched, and thus, the oxide layer, i.e., the inter-layer insulation layer, formed over the fuse lines may obtain an insufficient thickness. Portions of the inter-layer insulation layers having a large thickness are more likely to have an insufficient etch target, and thus, the oxide layer formed over the fuse lines may have a large thickness.

SUMMARY OF THE INVENTION

It is, therefore, an object of the present invention to provide a method for fabricating a semiconductor device using a repair etching process, wherein the method can provide a uniform thickness in an insulation layer remaining over fuse lines.

In accordance with an aspect of the present invention, there is provided a method for fabricating a semiconductor device, including: forming fuse lines over a substrate; forming a first insulation layer over the fuse lines, the first insulation layer including a silicon-rich oxynitride (SRON) layer at the top; forming a second insulation layer over the first insulation layer, the second insulation layer configured in a multiple-layer structure and including oxide-based materials; performing a first repair etching process to selectively etch the second insulation layer; performing a second repair etching process to remove the second insulation layer remaining after performing the first repair etching process; and performing a third repair etching process to etch the first insulation layer in a manner such that the first insulation layer remains with a predetermined thickness above the fuse lines.

BRIEF DESCRIPTION OF THE DRAWINGS

The above and other objects and features of the present invention will become better understood with respect to the following description of the exemplary embodiments given in conjunction with the accompanying drawings, in which.

DETAILED DESCRIPTION OF THE INVENTION

A method for fabricating a semiconductor device in accordance with exemplary embodiments of the present invention will be described in detail with reference to the accompanying drawings.

FIGS. 2A to 2D illustrate cross-sectional views to describe a repair etching method in accordance with a specific embodiment of the present invention.

Figure 1:
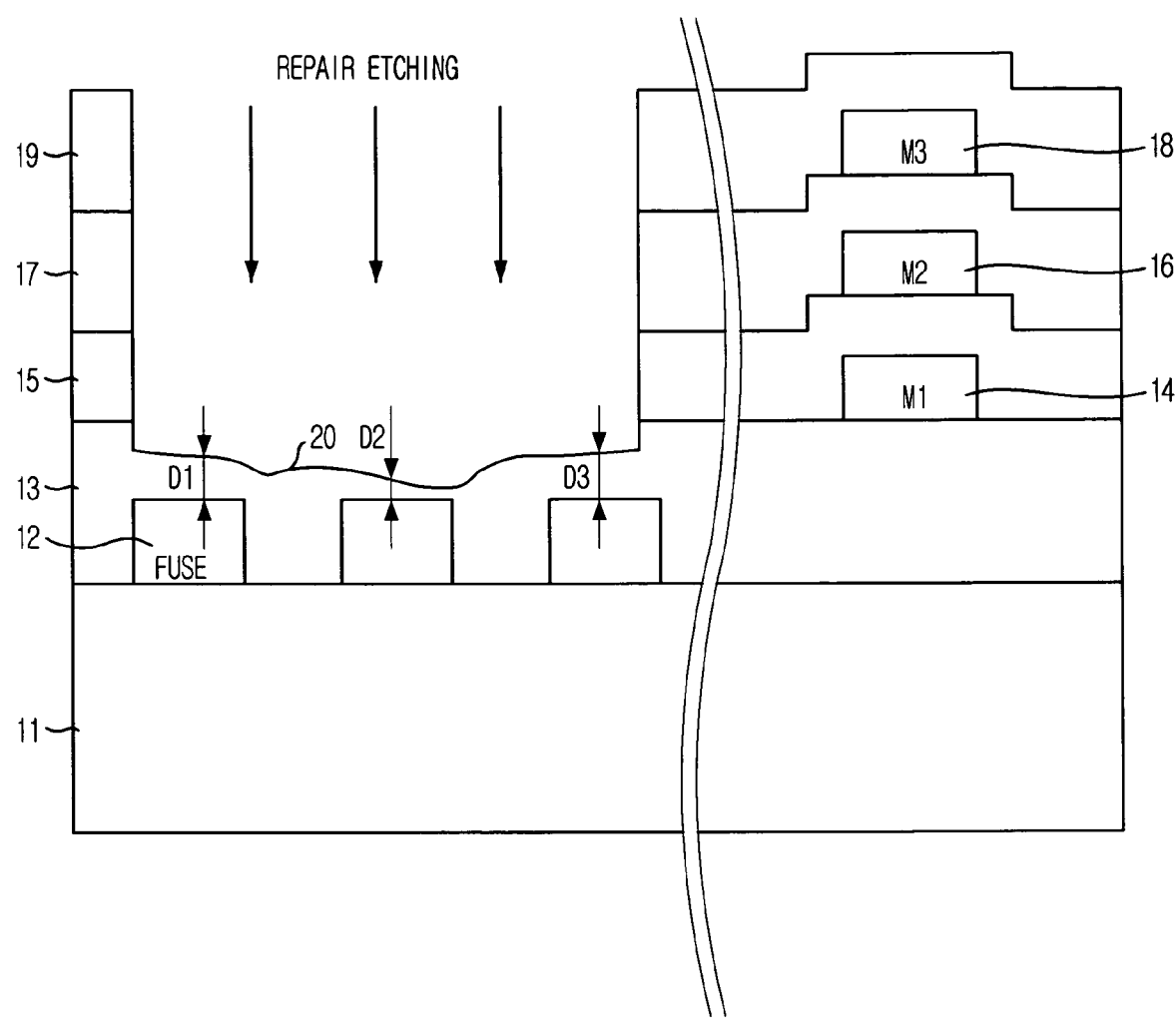
FIG. 1 is a cross-sectional view illustrating a typical repair etching method in a semiconductor device.
Figure 2A:
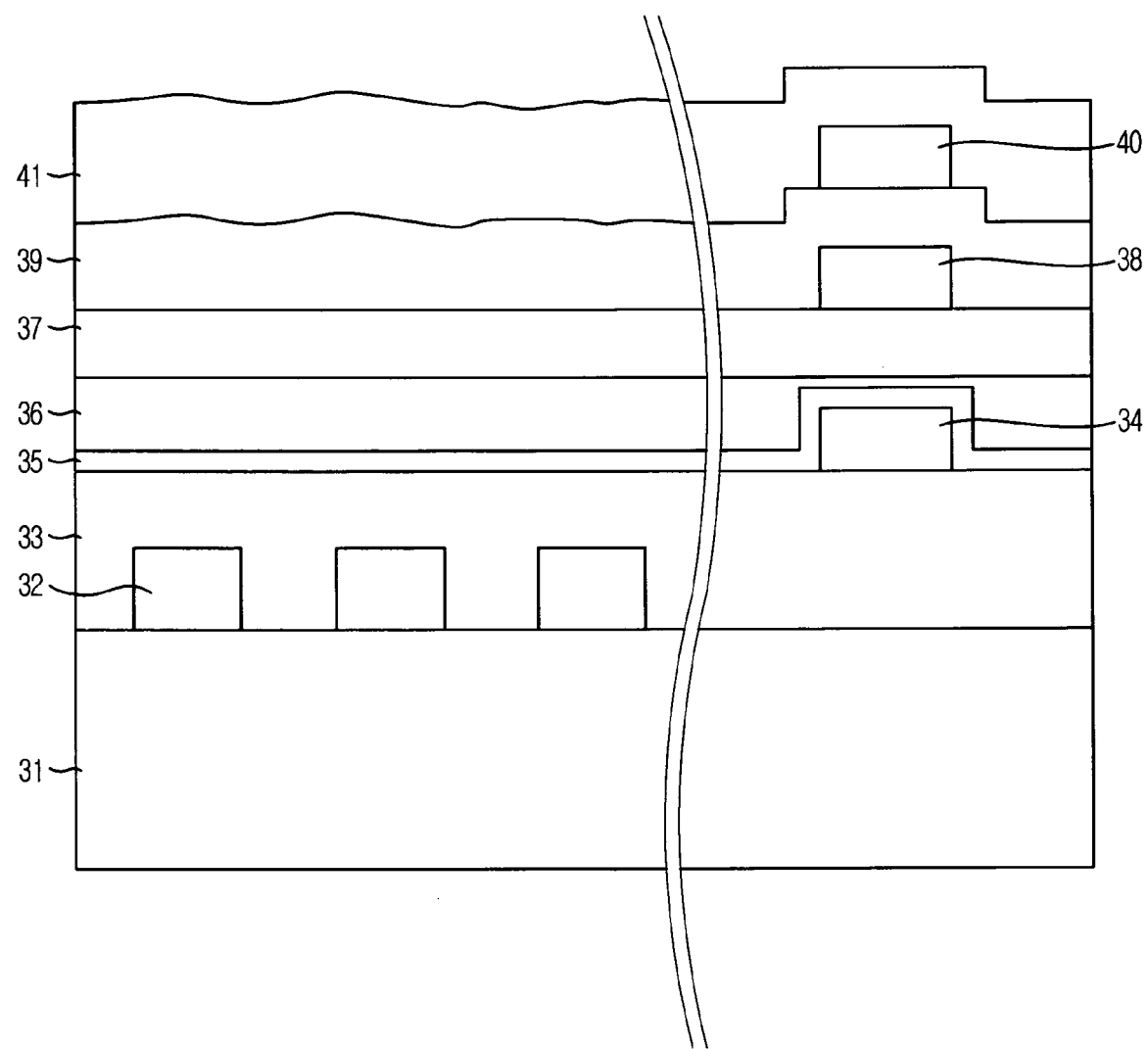
FIGS. 2A to 2D are cross-sectional views illustrating a repair etching method in accordance with a specific embodiment of the present invention.

Referring to FIG. 2A, fuse lines 32 are formed over a substrate 31. When failures are generated in a semiconductor device, typical fuse lines are formed to repair portions with the failures in the semiconductor device. The typical fuse lines are not formed by an additional process, but formed by using a conductive layer in a cell region. In this specific embodiment of the present invention, the fuse lines 32 are formed by employing plate lines.

A first inter-layer insulation layer 33 is formed over the fuse lines 32 and the substrate 31. The first inter-layer insulation layer 33 includes an oxide-based material. For instance, the first inter-layer insulation layer 33 may be one selected from a group consisting of borophosphosilicate glass (BPSG), tetraethyl orthosilicate (TEOS), spin on glass (SOG), high density plasma (HDP) oxide, and oxynitride.

A first metal line 34 is formed over the first inter-layer insulation layer 33 in a cell region of the substrate 31. A TEOS oxide layer 35 is formed over the first inter-layer insulation layer 33 and the first metal line 34. A SOG layer 36 is formed over the TEOS oxide layer 35 for planarization.

The SOG layer 36 is formed to eliminate surface irregularity after the first metal line 34 and the TEOS oxide layer 35 are formed. That is, the SOG layer 36 provides a planarized surface when forming a silicon-rich oxynitride (SRON) layer 37 subsequently.

The SRON layer 37 is formed over the SOG layer 36. The SRON layer 37 is formed to provide a different etch rate during a subsequent repair etching. The SRON layer 37 is formed to a thickness ranging from approximately 2,000 Å to approximately 5,000 Å using a gas including nitrogen ($N_2$), silane ($SiH_4$), and nitrous oxide ($N_2O$).

A multiple-layer insulation layer is formed over the SRON layer 37. The multiple-layer insulation layer includes a second inter-layer insulation layer 39 formed over a second metal line 38 and a passivation layer 41 formed over a third metal line 40. The second and third metal lines 38 and 40 are formed in the cell region of the substrate 31. The multiple-layer insulation layer includes a material substantially the same as the first inter-layer insulation layer 33.

A multiple-layer structure, that is, the inter-layer insulation layers used in forming a TLM structure including the first, second, and third metal lines 34, 38, and 40, is formed with an irregular surface profile as the thickness of the inter-layer insulation layers increases. Especially, irregularity of the surface profile up to the second and third metal lines 38 and 40 are conspicuous.

A repair etching process is performed to open a fuse box as described below.

Figure 2B:
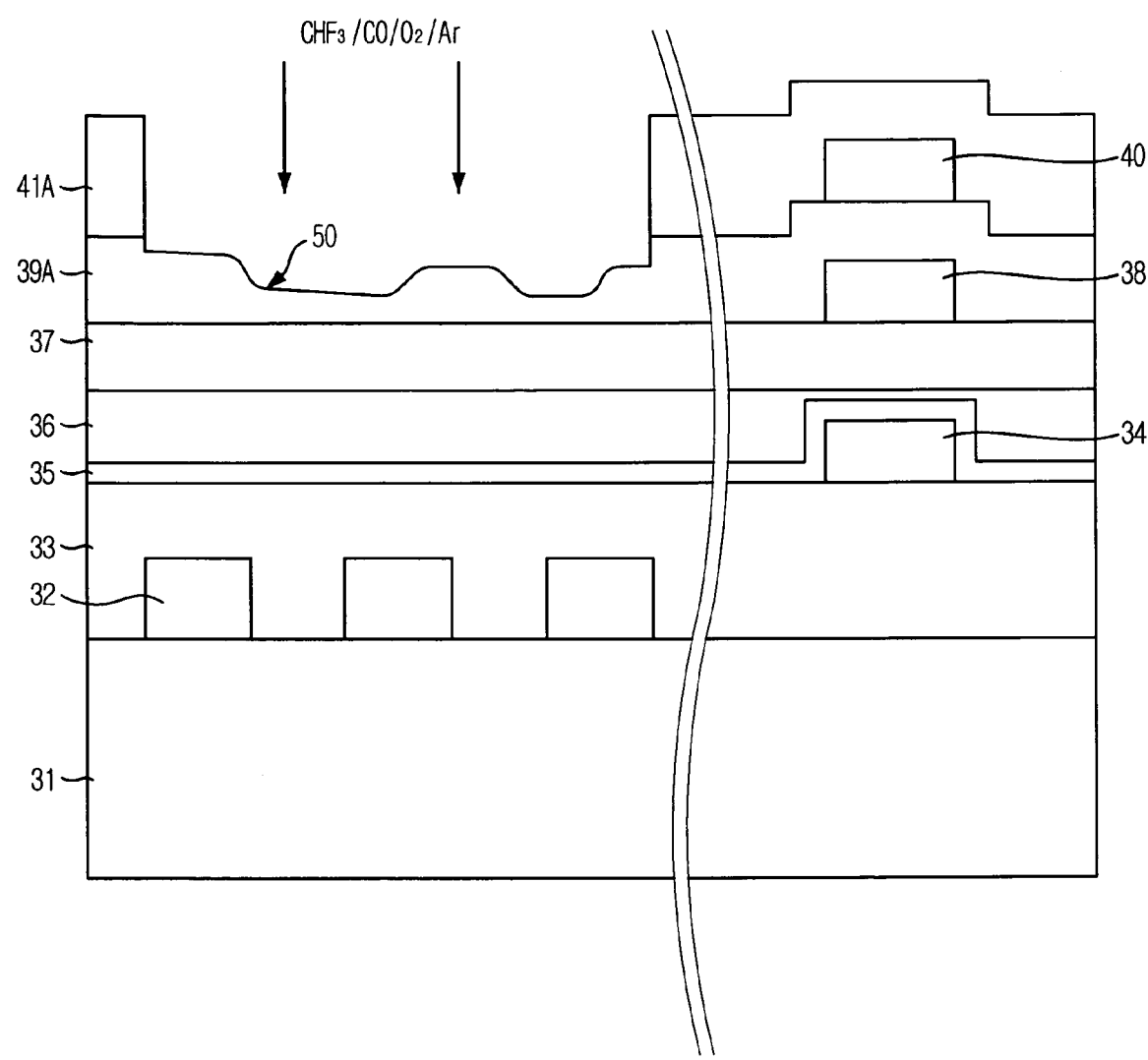

Referring to FIG. 2B, a first repair etching process is performed to form a patterned second inter-layer insulation layer 39A and a patterned passivation layer 41A. In more detail, a predetermined portion of the second inter-layer insulation layer 39 and a predetermined portion of the passivation layer 41 are etched to form the patterned second inter-layer insulation layer 39A and the patterned passivation layer 41A.

The first repair etching process uses a main gas including trifluoromethane ($CHF_3$) gas and carbon monoxide (CO) gas. A gas including the main gas, oxygen ($O_2$) gas, and argon (Ar) gas, that is, a gas mixture including $CHF_3$ gas, CO gas, $O_2$ gas, and Ar gas is used to etch the multiple-layer insulation layer including the second inter-layer insulation layer 39 and the passivation layer 41.

During the first repair etching process, not all of the multiple-layer insulation layer in a region for opening the fuse box is etched away. The multiple-layer insulation layer is etched in a manner such that a portion of the patterned second inter-layer insulation layer 39A remains over the SRON layer 37. The remaining portion of the patterned second inter-layer insulation layer 39A has a thickness ranging from approximately 1,000 Å to approximately 3,000 Å.

After the first repair etching process, the remaining portion of the patterned second inter-layer insulation layer 39A over the SRON layer 37 has an irregular surface profile 50. The irregular surface profile 50 is formed because the multiple-layer insulation layer having irregular surface profiles is etched at a substantially identical etch speed.

Figure 2C:
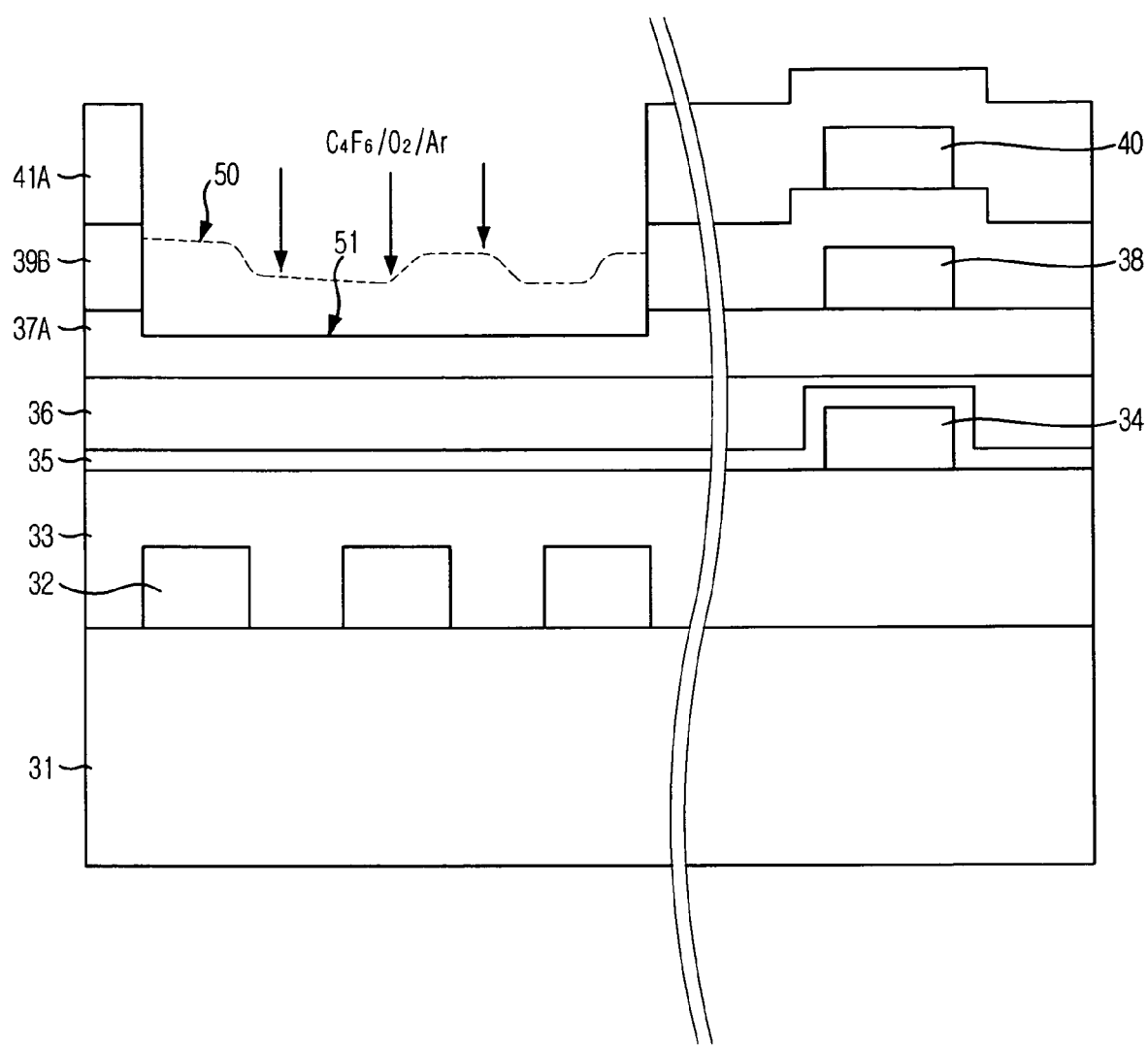

Referring to FIG. 2C, a second repair etching process is performed to obtain a remaining second inter-layer insulation layer 39B and a patterned SRON layer 37A. In more detail, the second repair etching process is performed to etch the remaining portion of the patterned second inter-layer insulation layer 39A having the irregular surface profile 50 and a portion of the SRON layer 37 in the region for opening the fuse box.

Conditions for the second repair etching process are determined in a manner such that an etch speed for the SRON 37 is slower than that for the patterned second inter-layer insulation layer 39A. That is, the SRON layer 37 is prevented from being etched while the remaining portion of the patterned second inter-layer insulation layer 39A is being etched.

The second repair etching process uses a gas including hexafluorocyclobutene ($C_4F_6$) gas, $O_2$ Gas, and Ar gas. $C_4F_6$ gas flows at a flow rate ranging from approximately 18 sccm to approximately 24 sccm, $O_2$ Gas flows at a flow rate ranging from approximately 17 sccm to approximately 22 sccm, and Ar gas flows at a flow rate ranging from approximately 500 sccm to approximately 1,500 sccm. As a ratio of $O_2$ Gas to $C_4F_6$ gas decreases, an etch rate of the SRON layer 27 decreases.

Under the above conditions of the second repair etching process, the patterned second inter-layer insulation layer 39A is etched at an etch speed of approximately 40 Å/sec, and the SRON layer 37 is etched at an etch speed of approximately 5 Å/sec.

The patterned SRON layer 37A has a surface profile 51 with a relatively uniform thickness when compared to the irregular surface profile 50. The SRON layer 37 below the remaining portion of the patterned second inter-layer insulation layer 39A is almost free of losses when the remaining portion of the patterned second inter-layer insulation layer 39A is etched away, and consequently, the surface profile 51 is obtained.

Figure 2D:
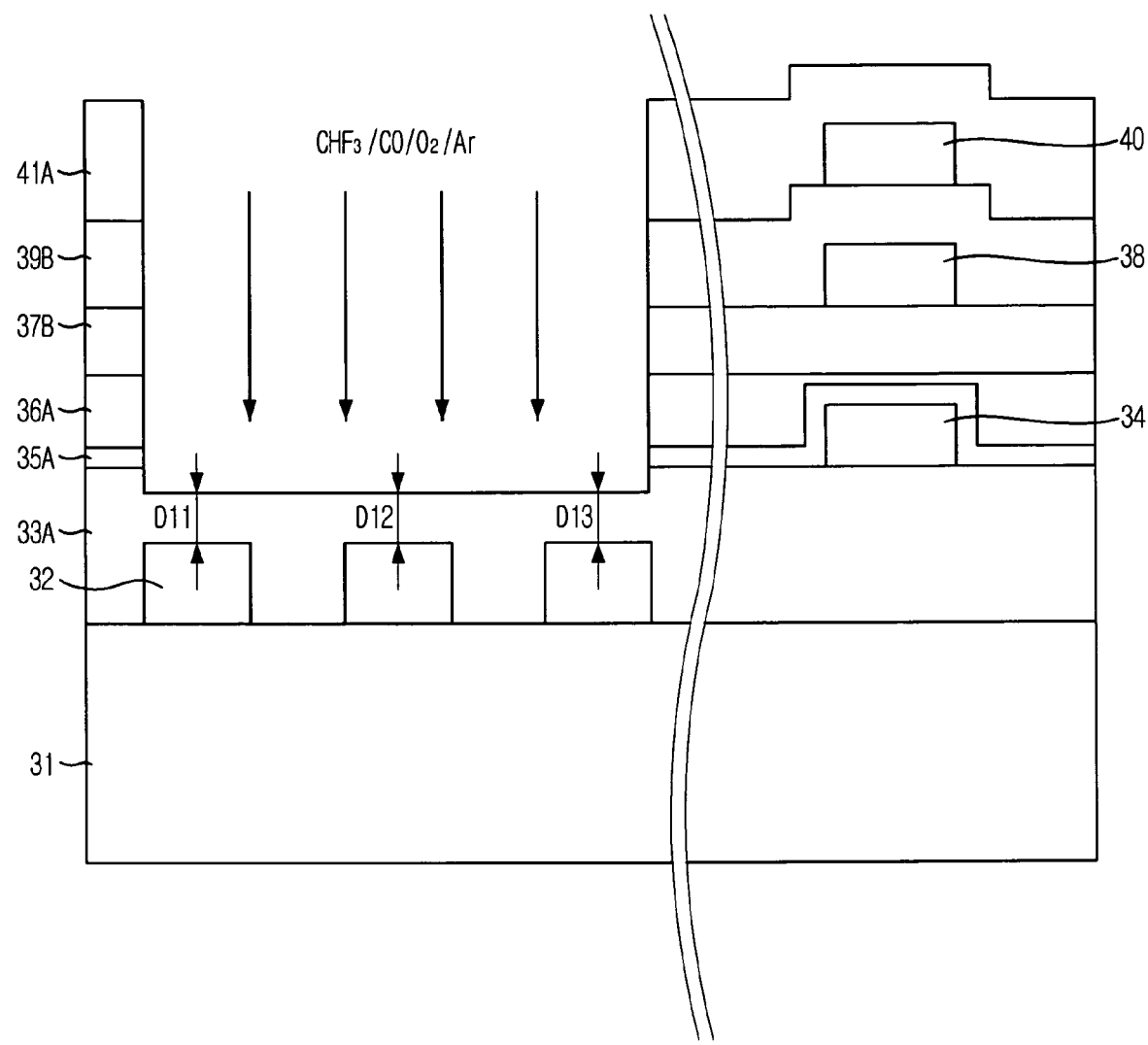

As shown in FIG. 2D, a third repair etching process is performed to etch a predetermined portion of the patterned SRON layer 37A, the SOG layer 36, the TEOS oxide layer 35, and the first inter-layer insulation layer 33 to form a remaining SRON layer 37B, a patterned SOG layer 36A, a patterned TEOS oxide layer 35A, and a patterned first inter-layer insulation layer 33A, respectively. The patterned first inter-layer insulation layer 33A remains over the fuse lines 32 with a uniform thickness.

The third repair etching process is performed under conditions substantially identical to those of the first repair etching process. The third repair etching process is performed until a portion of the patterned first inter-layer insulation layer 33A remaining above the fuse lines 32 reaches a thickness ranging from approximately 2,500 Å to approximately to approximately 3,000 Å.

The remaining portion of the patterned first inter-layer insulation layer 33A above the fuse lines 32 has a uniform thickness after the third repair etching process is performed as denoted with reference denotations D11, D12, and D13.

According to the specific embodiment of the present invention, the SRON layer is employed as an inter-layer insulation layer and the repair etching processes are performed with different etch rates for the inter-layer insulation layer, such that the insulation layer remains with a uniform thickness over the fuse lines.

In accordance with the specific embodiment of the present invention, the repair etching processes result in the stabilized thickness of the remaining inter-layer insulation layer using the etch rates between the inter-layer insulation layers.

The present application contains subject matter related to the Korean patent application No. KR 2005-112884, filed in the Korean Patent Office on Nov. 24, 2005, the entire contents of which being incorporated herein by reference.

While the present invention has been described with respect to certain specific embodiments, it will be apparent to those skilled in the art that various changes and modifications may be made without departing from the spirit and scope of the invention as defined in the following claims.

What is claimed is:

1. A method for fabricating a semiconductor device, the method comprising:

forming fuse lines over a substrate;

forming a first insulation layer over the fuse lines, the first insulation layer including a silicon-rich oxynitride (SRON) layer at the top;

forming a second insulation layer over the first insulation layer, the second insulation layer configured in a multiple-layer structure and including oxide-based materials;

performing a first repair etching process to selectively etch the second insulation layer;

performing a second repair etching process to remove the second insulation layer remaining after performing the first repair etching process; and performing a third repair etching process to etch the first insulation layer in a manner such that the first insulation layer remains with a predetermined thickness above the fuse lines.

2. The method of claim 1, wherein the forming of the first insulation layer comprises:

forming an oxide-based layer over the fuse lines;

forming a first metal line over the oxide-based layer;

forming a tetraethyl orthosilicate (TEOS) layer over the first metal line and the oxide-based layer;

forming a spin on glass (SOG) layer over the TEOS layer, the SOG layer planarized and having a height substantially same as the first metal line; and forming a SRON layer over the SOG layer.

3. The method of claim 1, wherein the forming of the second insulation layer comprises including a material selected from the group consisting of borophosphosilicate glass (BPSG), TEOS, SOG, high density plasma (HDP) oxide, and oxynitride.

4. The method of claim 1, wherein the SRON layer is formed in a thickness ranging from approximately 2,000 Å to approximately 5,000 Å using a mixture gas including nitrogen ($N_2$), silane ($SiH_4$), and nitrous oxide ($N_2O$).

5. The method of claim 1, wherein the performing of the first repair etching process comprises etching the second insulation layer to remain over the first insulation layer in a thickness ranging from approximately 1,000 Å to approximately 3,000 Å.

6. The method of claim 5, wherein the performing of the first repair etching process comprises using a main gas added with a mixture gas of $O_2$ gas and Ar gas, the main gas including trifluoromethane ($CHF_3$) gas and carbon monoxide (CO) gas.

7. The method of claim 6, wherein the performing of the third repair etching process comprises etching such that a portion of the first insulation layer remaining above the fuse lines has a thickness ranging from approximately 2,500 Å to approximately to approximately 3,000 Å.

8. The method of claim 1, wherein the performing of the second repair etching process comprises conditions in which the second insulation layer is etched at a faster etch rate than the SRON layer of the first insulation layer.

9. The method of claim 8, wherein the performing of the second repair etching process comprises etching the second insulation layer at an etch rate of approximately 40 Å/sec, and etching the SRON layer at an etch rate of approximately 5 Å/sec.

10. The method of claim 9, wherein the performing of the second repair etching process comprises using a mixture gas including $C_4F_6$ gas, oxygen ($O_2$) Gas, and argon (Ar) gas.

11. The method of claim 10, wherein the mixture gas comprises conditions in which the etch rate of the SRON layer decreases as a ratio of $O_2$ Gas to $C_4F_6$ gas decreases.

12. The method of claim 11, wherein the performing of the second repair etching process comprises flowing $C_4F_6$ gas at a flow rate ranging from approximately 18 sccm to approximately 24 sccm, $O_2$ Gas at a flow rate ranging from approximately 17 sccm to approximately 22 sccm, and Ar gas at a flow rate ranging from approximately 500 sccm to approximately 1,500 sccm.

* * * * *